(12) United States Patent
Vinther

(10) Patent No.: US 6,909,056 B2
(45) Date of Patent: *Jun. 21, 2005

(54) COMPLIANT ELECTRICAL CONTACT ASSEMBLY

(75) Inventor: Gordon A. Vinther, North Hampton, NH (US)

(73) Assignee: Ardent Concepts, Inc., Hampton Beach, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/834,727

(22) Filed: Apr. 29, 2004

(65) Prior Publication Data

US 2004/0200633 A1 Oct. 14, 2004

Related U.S. Application Data

(63) Continuation-in-part of application No. 10/341,723, filed on Jan. 14, 2003, now Pat. No. 6,787,709.
(60) Provisional application No. 60/349,850, filed on Jan. 17, 2002, and provisional application No. 60/349,852, filed on Jan. 17, 2002.

(51) Int. Cl.[7] ............................. H05K 1/16; H05K 1/11
(52) U.S. Cl. ....................... 174/260; 174/261; 174/267; 439/66
(58) Field of Search ........................ 174/36, 260, 261, 174/267; 361/769, 787; 324/149, 537, 538, 754, 765; 439/66, 67, 91

(56) References Cited

U.S. PATENT DOCUMENTS

| | | | |
|---|---|---|---|
| 4,029,375 A | 6/1977 | Gabrielian | |
| 4,998,886 A | 3/1991 | Werner | |
| 5,017,738 A | 5/1991 | Tsuji et al. | |
| 5,101,553 A | 4/1992 | Carey et al. | |
| 5,167,512 A * | 12/1992 | Walkup | 439/66 |
| 5,230,632 A | 7/1993 | Baumberger et al. | |
| 5,388,998 A | 2/1995 | Grange et al. | |
| 5,495,667 A | 3/1996 | Farnworth et al. | |
| 5,667,410 A | 9/1997 | Johnston | |
| 6,033,233 A | 3/2000 | Haseyama et al. | |
| 6,043,666 A * | 3/2000 | Kazama | 324/754 |
| 6,150,616 A * | 11/2000 | Kazama | 174/267 |
| 6,341,962 B1 * | 1/2002 | Sinclair | 439/66 |
| 6,400,172 B1 | 6/2002 | Akram et al. | |
| 2004/0147140 A1 * | 7/2004 | Fan et al. | 439/66 |

FOREIGN PATENT DOCUMENTS

| | | |
|---|---|---|
| EP | 0462706 A1 | 12/1991 |
| GB | 2 273 830 A | 12/1993 |
| WO | WO 92/08258 | 5/1992 |

* cited by examiner

Primary Examiner—William H. Mayo, III
(74) Attorney, Agent, or Firm—Altman & Martin

(57) ABSTRACT

A compliant electrical contact assembly for temporarily interfacing two electrical devices. The assembly includes a contact with a closed coil with opposed contact points and an axis that is angled from the direction of the compression force holding the assembly sandwiched between the electrical devices. The electrically shorted loops of the coil slide on the surfaces of one another as the compression force is applied, providing compliance. The contact can be made extremely small such that pitches in the micrometer range can be achieved with very low inductance values. The contact is installed in a through aperture in a dielectric panel. The coil fits into a center section of the aperture. The contact points extend from opposed openings of the aperture. Optionally, the aperture is filled with a compliant, conductive elastomer.

12 Claims, 7 Drawing Sheets

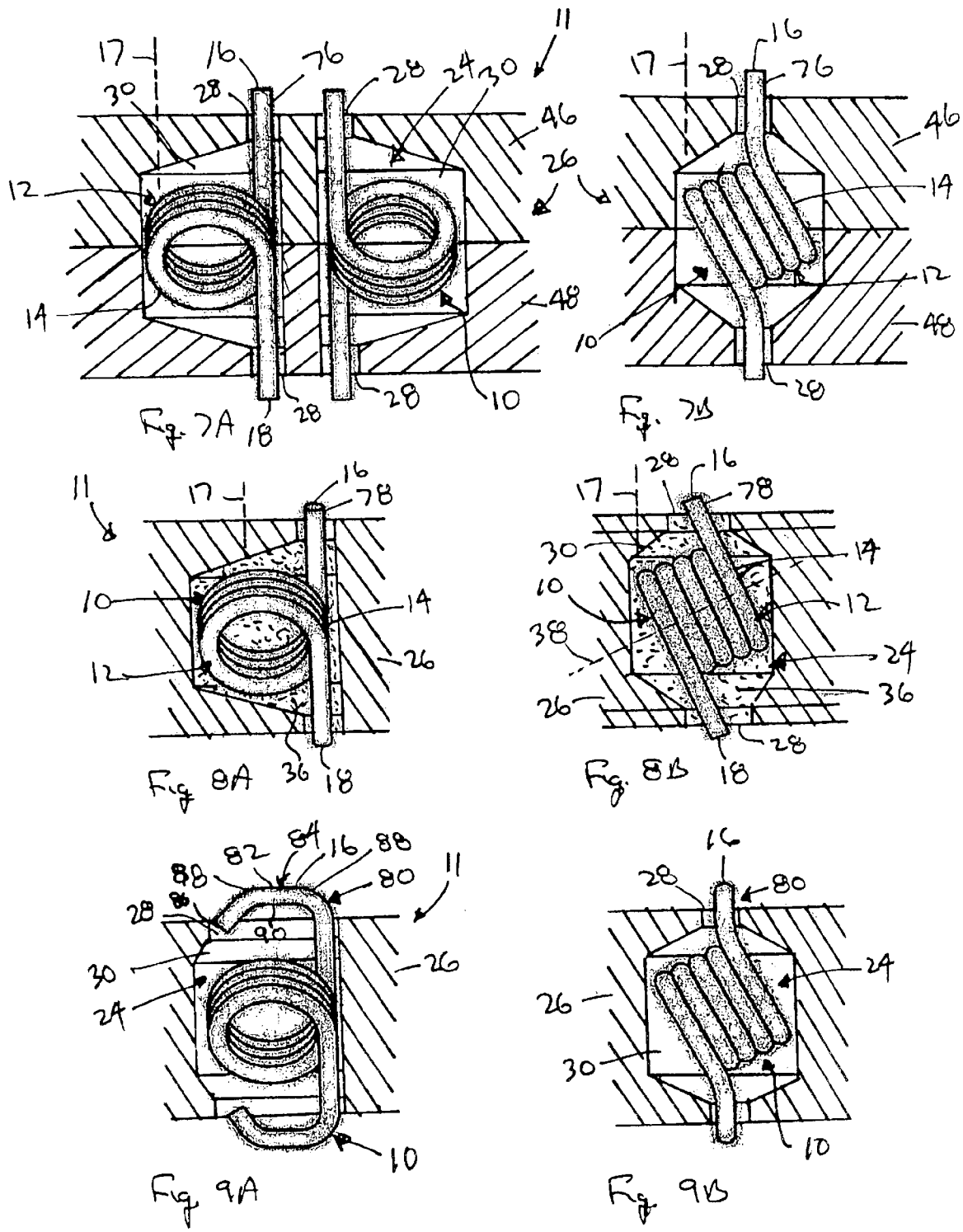

COMPLIANT ELECTRICAL CONTACT ASSEMBLY

CROSS-REFERENCES TO RELATED APPLICATIONS

The present application is a continuation-in-part application of application Ser. No. 10/341,723, dated Jan. 14, 2003 for COMPLIANT ELECTRICAL CONTACT in the name of Gordon A. Vinther, now Pat. No. 6,787,709, which claims the benefit of U.S. Provisional Patent Application No. 60/349,850, dated Jan. 17, 2002, for SKEWED COIL ELECTRICAL CONTACT, in the name of Gordon A. Vinther, and U.S. Provisional Patent Application No. 60/349,852, dated Jan. 17, 2002, for TANGLED WIRE ELECTRICAL CONTACT, in the name of Gordon A. Vinther.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to electrical contacts, more particularly, to very small compliant electrical contacts with very low inductance at high frequencies.

2. Description of the Related Art

The purpose of an electrical contact is to provide a separable electrical interconnection between two electrical conductors. The characteristic of separability means that the conductors are not interconnected by permanent mechanical means, such as soldering or bonding, but by temporary mechanical means. Consequently, in order to maintain a good mechanical contact in an attempt to minimize detrimental electrical effects of the contact, some form of spring force is used to press the two conductors together. These electrical contacts are called compliant (as in "flexible") contacts.

Small compliant contacts are necessary for separably interconnecting integrated circuit (IC) devices to whatever electrical device the user desires. A prime example is connecting the IC to a test fixture or sorting equipment used for testing and sorting IC's during manufacture. The compliant contact should be as close to electrically transparent as possible in order to minimize parasitic effects, such as inductance, that alter the signals to and from the IC which could lead to erroneous results.

Compliant contacts provide another advantage in that they can compensate for noncoplanarities of the electronic unit under test (UUT) being connected. The conduction points on the UUT are not exactly coplanar, that is, they are not within the same plane, even between the same conduction point on different UUT's. The compliant contacts deflect by different amounts depending upon the actual position of the conduction point.

Conventional compliant contacts for connecting to UUT's include spring probes, conductive rubber, compliant beam contacts, and bunched up wire called fuzz buttons. Each technology provides the necessary means to overcome the noncoplanarities between the contact points and provides uniform electrical contact throughout a plurality of contacts. Each technology has shortcomings in one characteristic or another and all have high electrical parasitic characteristics. In addition, they are relatively expensive to manufacture.

A typical spring probe consists of at least three or four parts, a hollow barrel with a spring and one or two plungers. The spring is housed in the barrel with the end of the plungers crimped in opposed open ends of the barrel at the ends of the spring. The spring biases the plungers outwardly, thereby providing a spring force to the tip of the plungers. Spring probes can have highly varying degrees of compliance and contact force, and are generally very reliable for making contact many times or for many cycles. Spring probes can accommodate many different conduction interfaces, such as pads, columns, balls, etc. Spring probes, however, have a size problem in that the spring itself cannot be made very small, otherwise consistent spring force from contact to contact cannot be maintained. Thus, spring probes are relatively large, leading to an unacceptably large inductance when used for electrical signals at higher frequencies. Additionally, spring probes are relatively costly since the three components must be manufactured separately and then assembled.

Conductive rubber contacts are made of rubber and silicones of varying types with embedded conductive metal elements. These contact solutions usually are less inductive than spring probes, but have less compliance and are capable of fewer duty cycles than spring probes. The conductive rubber works when the conduction point is elevated off the UUT thus requiring a protruding feature from the UUT or the addition of a third conductive element to the system to act as a protruding member. This third member lessens the contact area for a given contact force and thus increases the force per unit area so that consistent contact can be made. The third element may be a screw machined button which rests on the rubber between the conduction point. This third element can only add inductance to the contact system.

Compliant beam contacts are made of a conductive material formed such that deflection and contact force is attained at one end to the UUT conduction point while the other end remains fixed to the other conductor. In other words, the force is provided by one or more electrically conductive leaf springs. These contacts vary greatly in shape and application. Some compliant beam contacts are small enough to be used effectively with IC's. Some compliant beam contacts use another compliant material, such as rubber, to add to the compliance or contact force to the beam contact point. These later types tend to be smaller than traditional compliant beam contacts and thus have less inductance and are better suited for sorting higher frequency devices. However, these contacts still tend to be somewhat too large to be useful in some radio frequency (RF) applications.

Fuzz buttons are a relatively old yet simple technology in which a wire is crumpled into a cylindrical shape. The resulting shape looks very much like tiny cylinder made of steel wool. When the cylinder is placed within a hole in a sheet of nonconductive material, it acts like a spring that is continuously electrically shorted. It provides a less inductive electrical path than other contact technologies. Like rubber contacts, the fuzz button is most commonly used with a third element needed to reach inside the hole of the nonconductive sheet to make contact with the fuzz button. This third element increases parasitic inductance, degrading the signals to and from the UUT.

IC packaging technology is evolving toward being smaller, higher frequency (faster), and cheaper, resulting in new requirements for these types of electrical contacts. They need to perform adequately at the lowest cost.

BRIEF SUMMARY OF THE INVENTION

An object of the present invention is to provide a assembly that includes a compliant contact with a lower self-inductance at higher frequencies than existing technologies.

Another object is to provide a low-self-inductance contact assembly that provides sufficient compliance to test various UUT's.

Yet another object is to provide an assembly of low-self-inductance contacts that can be made extremely small for testing UUT's with close conductions points.

A further object is to provide a low-self-inductance contact assembly that is relatively inexpensive to manufacture.

The present invention is an assembly that provides a temporary interface between two electrical devices. The assembly is sandwiched between the electrical devices and a compression force holds the combination together. The assembly includes very low self-inductance, compliant contacts. The contact includes a coil of wire with a pair of opposed contact points for connection to conduction points on the electrical devices. The coil is at an angle to the direction of the compression. The smaller the angle, the greater the force necessary to compress the contact. During compression, the coil loops are electrically shorted while they slide along each other. The coil only needs to have enough of a loop to cause a short circuit between the leads when compressed, a minimum of just over 360°.

The wire is made of any electrically conductive material which has inherent elastic properties and the cross-sectional shape of the wire can be any shape, including round, square, triangular, elliptical, rectangular, or star, nor does the cross-sectional dimension have to be uniform over the length of the wire.

The contact points can each be configured in one of a variety of configurations.

The contact is placed within a through aperture in a dielectric panel. The aperture has openings at both ends of a center section. Optionally, the remaining space of the aperture is filled with a compliant, electrically conductive elastomer that adds resiliency and aids in electrically shorting the coil loops.

Other objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein:

FIGS. 7A and 7B are front and side views in partial cross-section of the contact with an offset straight lead in an assembly;

FIGS. 8A and 8B are front and side views in partial cross-section of the contact with a skewed straight lead in an assembly;

FIGS. 9A and 9B are front and side views in partial cross-section of the contact with a hook lead in an assembly;

DETAILED DESCRIPTION OF THE INVENTION

The present invention is an assembly 11 that provides an interface between two electrical devices, typically a unit under test (UUT) 2 and a test bed 4. The assembly 11 includes a compliant electrical contact 10 with a very low self-inductance.

Figure 2:
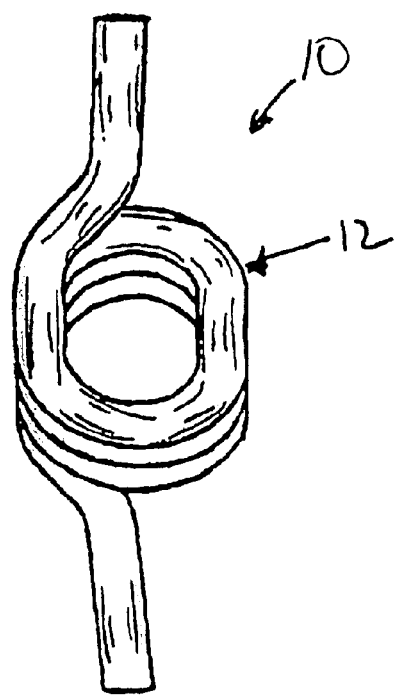
FIG. 2 is a side view of the contact with oval loops.
Figure 3:
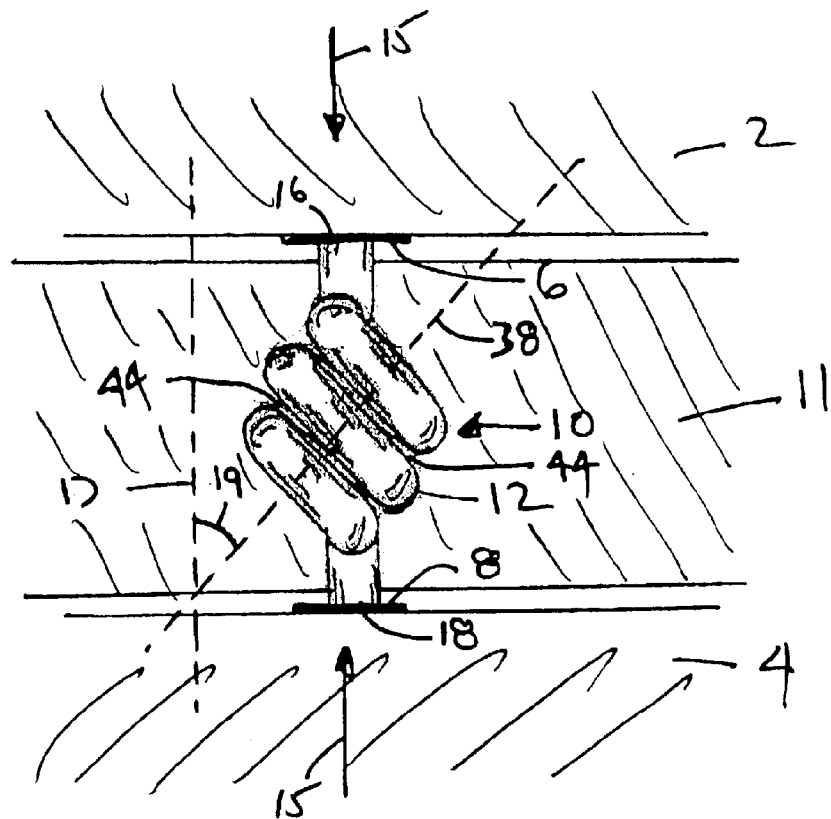
FIG. 3 is a cross-sectional view of the assembly of the present invention with a UUT and test bed.

The contact 10 is created by winding a length of electrically conductive wire into a coil 12. The coil 12 can be round, as in FIG. 1, or oval, as in FIG. 2. The coil 12 can have a constant diameter or can have a diameter that changes, such a conical shape. The gap 44 between loops 14 of the coil 12, shown in FIG. 3, ranges from essentially no gap (a closed coil) to a distance of up to about 100% of the largest wire cross-sectional dimension. The greater the wire cross-sectional dimension, the greater the gap 44 can be as a percentage of the cross-sectional dimension. For example, with a wire cross-sectional dimension of 0.0031 inch, a gap of 0.0001 inch (3%) is acceptable, whereas with a wire cross-sectional dimension of 0.020 inch, a gap of 0.010 inch (50%) is acceptable.

As described above and shown in FIG. 3, the contact provides a temporary electrical connection between the conduction points 6, 8 of a UUT 2 and a test bed 4. In order to provide a good electrical connection, the contact 10 is compressed by application of a compression force 15 along a direction of compression 17 between the UUT 2 and test bed 4 so that the spring force of the contact 10 pushes the contact points 16, 18 of the contact 10 against the UUT conduction point 6 and the test bed conduction point 8.

The coil 12 is oriented such that the direction of compression 17 is at an angle 19 to the coil axis 38. When applying a compression force 15 in the compression direction 17, the coil 12 provides compliance as the loops 14 slide along each other. When the compression force 15 is removed, the loops 14 return to their quiescent condition. While compressed, the coil 12 pushes the contact points 16, 18 against the conduction points 6, 8, providing an acceptable electrical connection. In addition, the coil 12 provides the necessary feature of adjusting for the noncoplanarities of the conduction points 6, 8.

Figure 4:
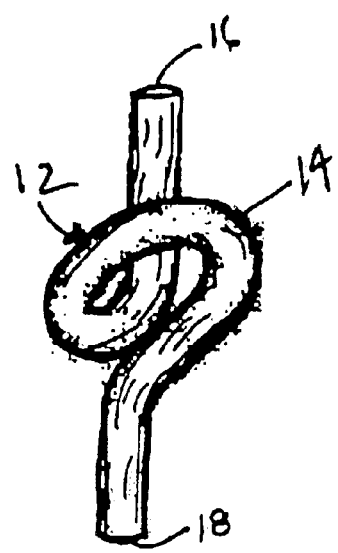
FIG. 4 is a perspective view of the contact with a minimum coil.

Once the gap 44 is closed, the loops 14 are electrically shorted throughout the remaining compression of the contact 10 while they slide along each other. The coil 12 only needs to have enough of a loop to cause a short circuit between the contact points 16, 18 when compressed, and thus can be extremely short with very low electrical parasitics. The smallest coil has slightly more than one loop, as shown in FIG. 4. The wire is coiled a minimum of just over 360° so that the ends of the coil 12 make contact during compression.

The magnitude of the angle 19 depends on the particular application and the compliance forces required for that application. The smaller the angle 19, the greater the force necessary to compress the contact 10, which means that the contact 10 will provide a greater force against the conduction points 6, 8. The magnitude of the angle 19 does have limits. As the angle 19 approaches zero, that is, parallel to the direction of compression 17, the contact 10 will not compress. And as the angle 19 passes 90°, that is, beyond perpendicular to the direction of compression 17, the loops 12 will not contact each other to form a short circuit between the contact points. Consequently, the practical range for the angle 19 is from approximately 5° to approximately 90°.

Figure 1:
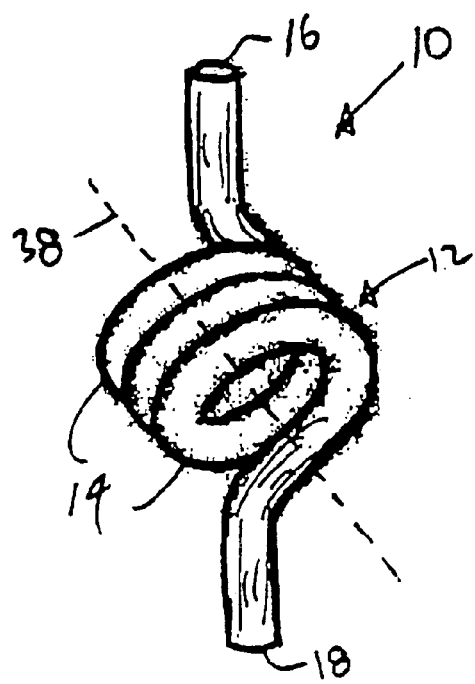
FIG. 1 is a perspective view of the basic contact of the present invention with a coaxial lead.
Figure 5:
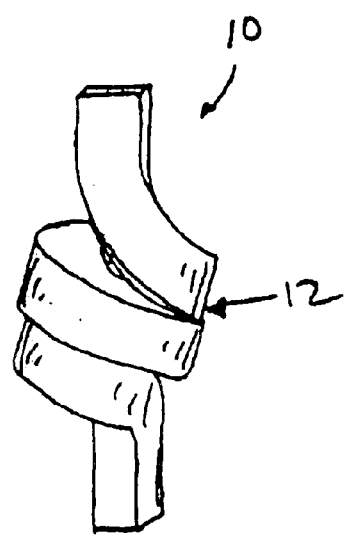
FIG. 5 is a side view of the contact made from a wire with rectangular cross-section.

In addition to the skew angle 19, the force versus deflection curve of the contact 10 is also determined by other coil parameters, such as the volume of the wire used in manufacturing the contact, e.g. the wire cross-sectional dimension, the coil diameter, and the number of loops, as well as the cross-sectional shape and wire material. The cross-sectional shape of the wire can be round, as shown in FIG. 1, or any other shape including square, as in FIG. 5, triangular, elliptical, rectangular, or star. The present invention also contemplates that the cross-sectional dimension does not have to be uniform over the length of the wire. When using wire with a cross-section having flat sides, such as rectangular or star-shaped, adjacent loops are in contact along a greater surface area than when using wire with a round or oval cross-section. Consequently, the shortest electrical path possible is created, resulting in a lower inductance connection. However, for cost and other reasons, wire with flat sides is not necessarily preferred over round and oval wire.

The wire can be made of any electrically conductive material which has inherent elastic properties, for example, stainless steel, beryllium copper, copper, brass, nickel-chromium alloy, and palladium-rare metal alloys, such as PALINEY 7®, an alloy of 35% palladium, 30% silver, 14% copper, 10% gold, 10% platinum, and 1% zinc. All of these materials can be used in varying degrees of temper from annealed to fully hardened.

As indicated above, the contact 10 is used in an assembly 11 that provides temporary electrical connections to conduction points 6, 8 between two electrical devices. In general, as shown in FIGS. 6A and 6B, the contact 10 is placed within a through aperture 24 in a dielectric panel 26. The aperture 24 has openings 28 at both ends of a section 30 through which the contact points 16, 18 protrude.

When a compression force 15 is applied in the compression direction 17 to the contact points 16, 18 protruding through the openings 28 of the dielectric panel 26, the left side of the loops 14, as seen in FIG. 6A, compress and the rights side of the loops expand, generally increasing the diameter of the coil 12. The aperture 24 maintains the position of the contact 10 as the compression force 15 is applied. The aperture 24 may also maintain the integrity of the contact 10 by preventing the coil loops 14 from separating under compression.

The contact 10 can be made extremely small by employing extremely small wire and forming apertures 24 in the dielectric panel 26 for testing UUT's with pitches smaller than 0.5 mm (0.020"). The contacts 10 are adaptable to silicon wafer probing with pitches in the micrometers.

FIGS. 6A–18 show examples of a number of different contact point, aperture, and dielectric panel configurations. Note that both contact points 16, 18 of each figure are of the same configuration. The present invention does not require that both contact points 16, 18 of a single contact be the same, but contemplates that the two contact points 16, 18 can have different configurations. The configurations shown are merely examples and are not intended to limit the present invention to any particular contact point, aperture, or dielectric panel configuration. Any contact point, aperture, and/or panel configuration that works for a particular application is contemplated by the present invention.

Figure 6E:
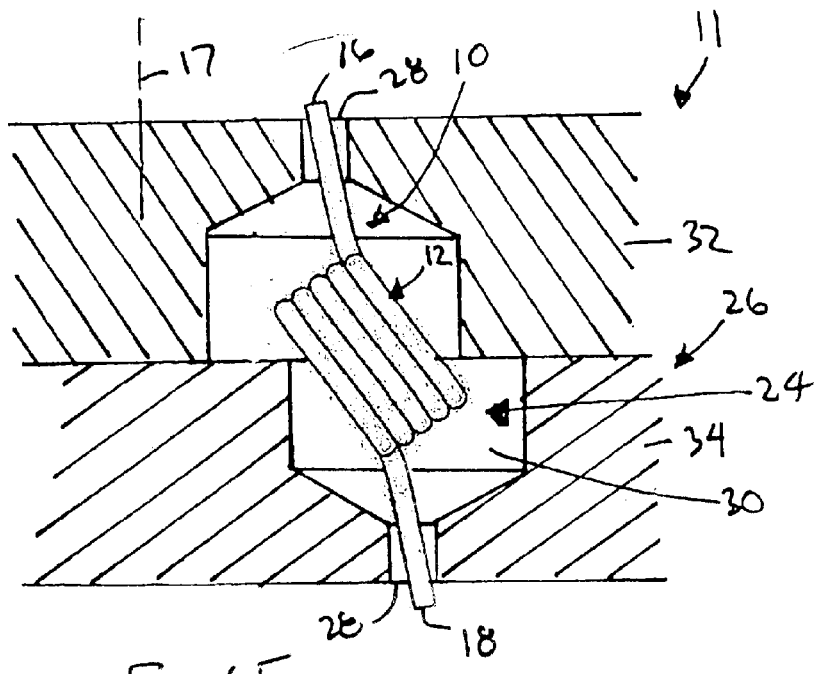
FIGS. 6A–6E are views in partial cross-section of the contact with a centered straight lead in an assembly.
Figure 6A:
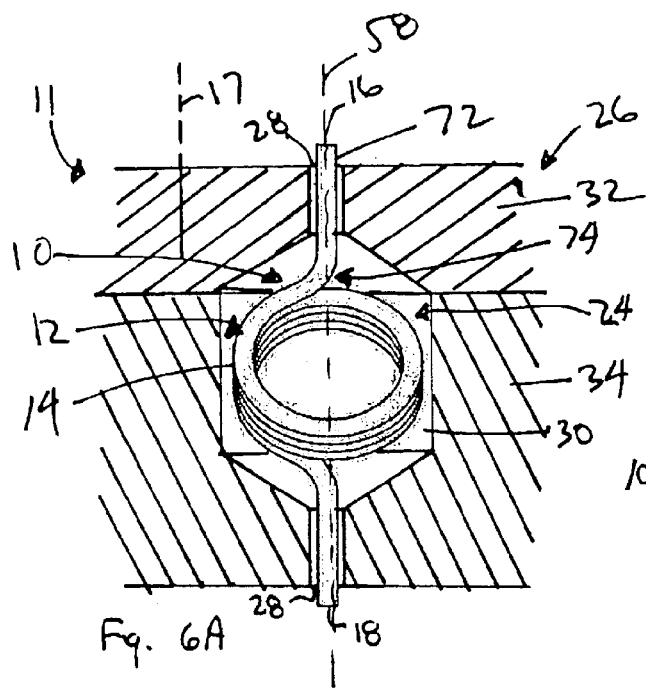
Figure 6B:
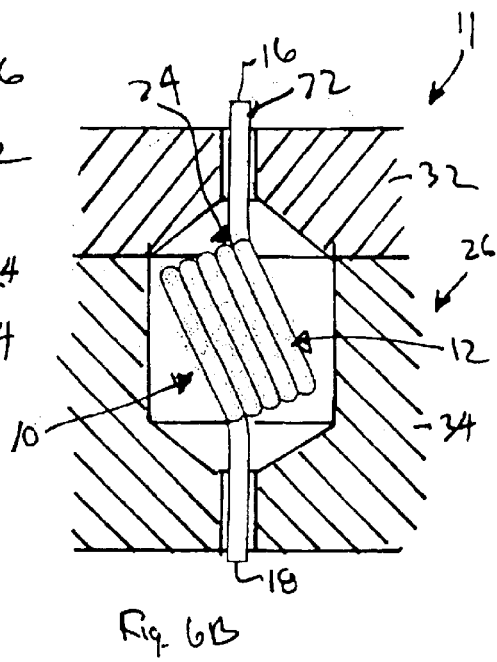
Figure 6C:
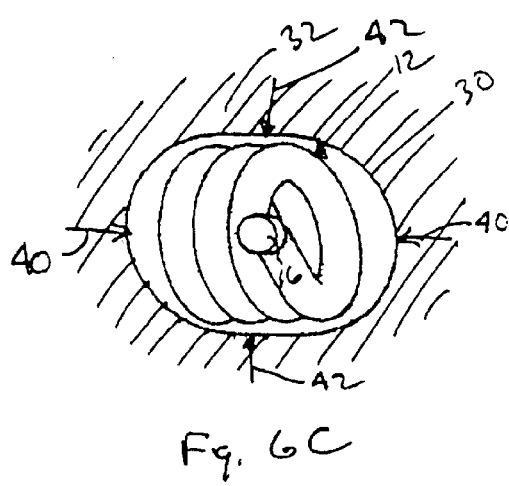

In FIGS. 6A–6E, the contact point 16 is at the end of a centered straight lead 72. The end of the coil 12 is bent through three dimensions, as at 74, to form the lead 72 that is generally aligned with the direction of compression 17 and, when viewed from the contact point 16, generally centered on the coil 12. The cross-sectional dimension of the center section 30 of the aperture 24 is slightly larger than the largest dimension of the contact 10 perpendicular to the leads 72. In the configuration of FIG. 6C, the center section 30 has an oval cross section, where the direction 40 in which the coil 12 expands has the larger dimension. The smaller dimension 42 can be the same as the coil dimension, since the coil 12 does not expand in that dimension 42. The openings 28 are generally coaxial with the center section 30 since the leads 72 are centered in the aperture 24. The aperture axis 58 of FIG. 6A is aligned with the direction of compression 17. The openings 28 are smaller than the coil 12 so that the contact 10 is captured by the aperture 24.

The dielectric panel 26 of FIG. 6A has a base sheet 34 that contains one of the openings 28 and most of the center section 30, and a top sheet 32 that contains the upper part of the center section and the other opening 28. The contact 10 is placed in the base sheet part of the aperture 24 and the sheets 32, 34 are sandwiched together, capturing the contact 10 within the aperture 24.

Figure 6D:
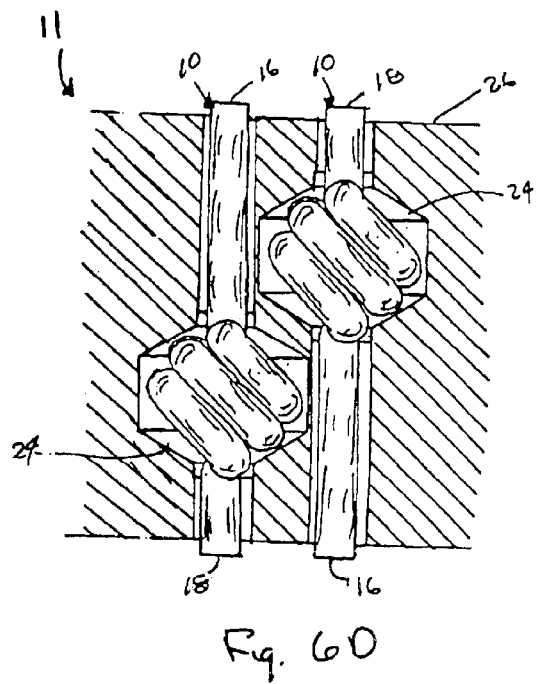

An alternate arrangement of the contacts 10 within a dielectric panel 26 is shown in FIG. 6D. Note that one contact point 16 extends farther from the coil 12 than the other contact point 18 and that the apertures 24 are elongated and staggered. With this arrangement, the contacts 10 can be placed closer together. Particular applications of this arrangement include 4-wire testing where each IC lead requires two contacts, one for a drive current and the other for high-impedance sensing.

Another alternate arrangement of the contact 10 within the dielectric panel 26 is shown in FIG. 6E. The aperture axis 58 is slanted so that the leads 72 are aligned with each other, but not with the direction of compression 17. This arrangement allows for translation between the contact point 16 and the electrical device conduction point 6. The panel 26 is split so that the two parts of the aperture 24 are offset from each other.

In the configuration of FIGS. 7A and 7B, the contact point 16 is at the end of an offset straight lead 76 which is also aligned with the direction of compression 17. The difference from the centered straight lead 72 is that, rather than being formed by a bend in three dimensions and centered, the end of the coil 12 extends at a tangent to the loop 14 and then bends in only two dimensions, so the lead 76 is at one side of the coil 12. Since the lead 76 is offset from the center of the contact 10, the openings 28 are not coaxial with the center section 30, but are to one side.

FIG. 7A illustrates an advantage of the parallel lead 76: the contacts 10 can be arranged very close together without having to elongate either of the leads 76, like with the coaxial lead 72 in FIG. 6D. Like the arrangement of FIG. 6D, particular applications of this arrangement include 4-wire testing where each IC lead requires two contacts, one for a drive current and the other for high-impedance sensing.

The dielectric panel 26 of FIG. 7A has two mirror image sheets 46, 48, where each sheet has one opening 28 and a half of the center section 30. The contact 10 is placed in one side of the aperture 24 and the sheets 46, 48 are sandwiched together, capturing the contact 10 within the aperture 24.

In the configuration of FIGS. 8A and 8B, the contact point 16 is at the end of a skewed straight lead 78 that is formed by ending the loop 14 so that the lead 78 extends at a tangent to the loop 14. The result is that the lead is not aligned with the direction of compression 17, as can be seen in FIG. 8B. Because the lead 78 is tangent to the coil 12, it is perpendicular to the coil axis 38. The aperture openings 28 are to the side of the center section 30, like those of the offset straight leads 76. However, because the skewed straight leads 78 are skewed from the direction of compression 17, the openings 28 may be elongated to allow for movement perpendicular to the direction of compression 17.

Optionally, as shown in FIGS. 8A and 8B, the space within the aperture 24 remaining after the contact 10 is installed is filled with a compliant, electrically conductive elastomer 36. The elastomer 36 performs a dual function. It adds to the resiliency of the contact 10, meaning that the contact 10 can tolerate more operational cycles than without the elastomer 36. The elastomer 36 also aids in electrically shorting the coil loops 14, thus potentially minimizing the electrical parasitic values of the contact system.

In the configuration of FIGS. 9A and 9B, the contact point 16 is the side 82 of a hook lead 80. The end of the coil 12 extends tangentially from the coil 12 like the offset straight lead 76 and then is curved to form a hook 84 so that the contact point 16 is along the side 82 of the lead 80, rather than at the end 86 of the lead 82. The hook 84 can be any shape that provides the required function. The hook 84 of FIG. 9A is formed of two bends 88 with a straight section 90 therebetween. Alternatively, the hook 84 may be a single bend of more than 90°. The aperture openings 28 are slots that bisect the center section 30 so that, when the hook 84 is compressed, it can flex into the slot.

Figure 10A:
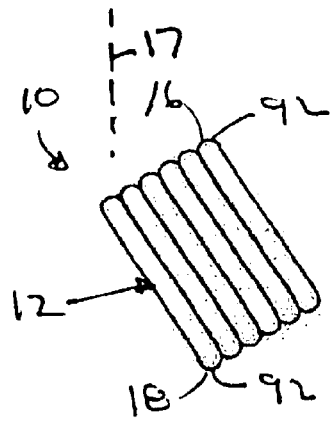
FIGS. 10A and 10B are front and side views of the contact with a nub contact point.
Figure 10B:
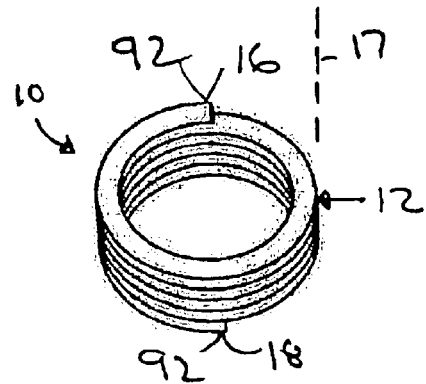
Figure 11A:
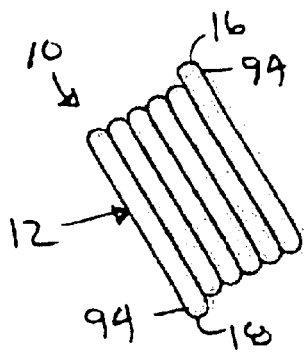
FIGS. 11A and 11B are front and side views of the contact with an alternate nub contact point.
Figure 11B:
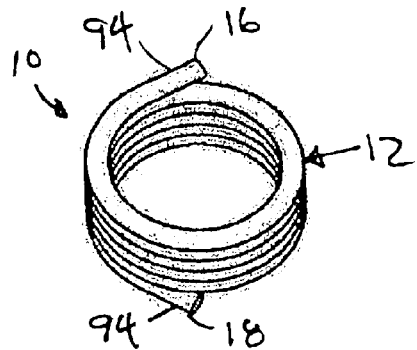

In the configuration of FIGS. 10A and 10B, the contact point 16 is a nub 92, which is the end of the coil 12 without any bends other than that of the loop 14. The nub 92 is aligned with the direction of compression 17. Alternatively, as shown in FIGS. 11A and 11B, the nub 92 is at the end of a very short lead 94 tangent to the coil 12, which may or may not be aligned with the direction of compression 17.

Figure 12A:
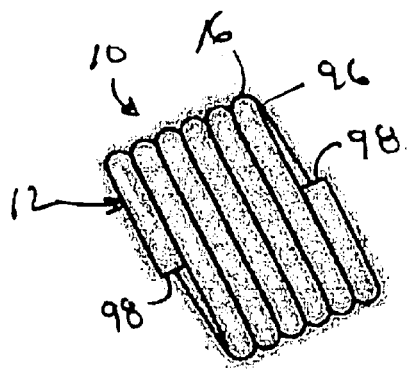
FIGS. 12A and 12B are front and side views of the contact with a loop contact point.
Figure 12B:
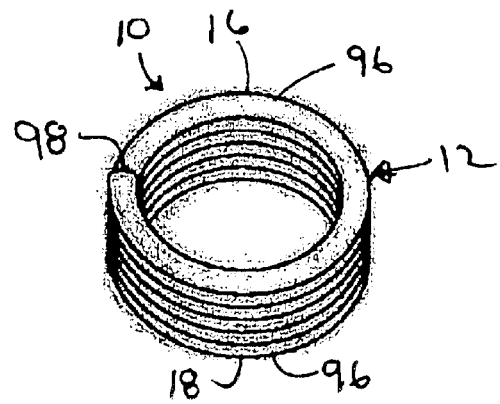

In the configuration of FIGS. 12A and 12B, the contact point 16 is the side 96 of a loop 14. It is essentially the same design as the nub 92 of FIGS. 10A and 10B, but with the coil 12 rotated so that the side 96 of a loop 14, rather than the end 98 of the coil 12, is the contact point 16. If both contacts 16, 18 are on sides of loops 14, there must be at least 1.5 loops 14.

Because the contact point configurations of FIG. 10A–12B do not have leads that extend substantially from the coil 14 like the other contact point configurations, the aperture configurations with a central section and smaller openings do not necessarily provide optimum performance. FIGS. 13–18 illustrate aperture configurations more appropriate to these contact point configurations.

Figure 13:
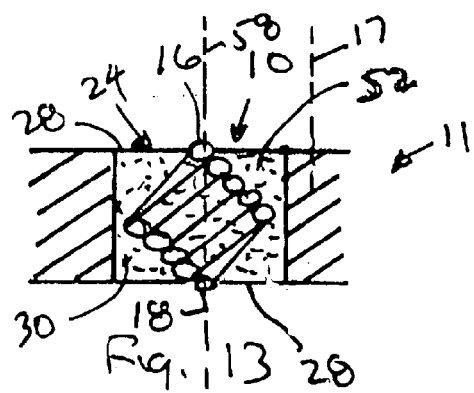
FIGS. 13–18 are side views in cross-section of various assembly apertures.
Figure 14:
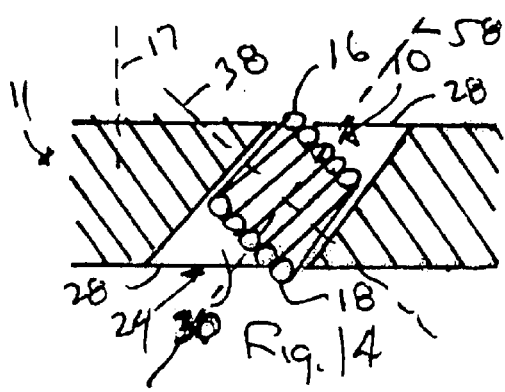
Figure 15:
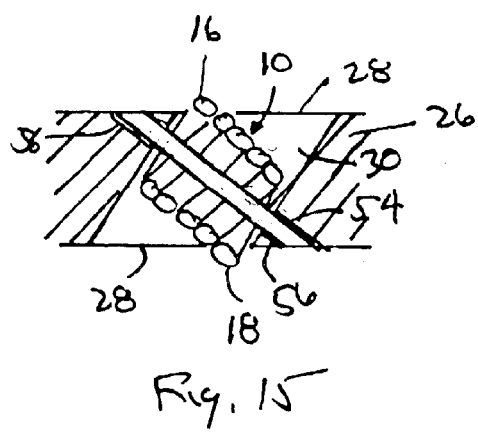

The aperture 24 of FIG. 13 has an axis 58 that is aligned with the direction of compression 17, where the contact 10 is placed in the center section 30 with the contact points 16, 18 extending from the openings 28. The contact 10 is held in place while a potting material 52 cures to secure the contact 10 in the correct orientation. The potting material 52 can be conductive or nonconductive. The aperture 24 of FIG. 14 has an axis 58 that is slanted from the direction of compression 17, where the angle of slant is substantially perpendicular to the angle of the coil axis 38. The contact 10 is secured in the center section 30 by either a friction fit, that is, the aperture 24 is slightly smaller than the contact 10, or by a potting material like that of FIG. 13. The contact points 16, 18 extend from the openings 28. The aperture 24 of FIG. 15 is slanted from the direction of compression 17, where the angle of the slant is essentially perpendicular to the angle of the coil axis 38. The contact 10 is secured in the center section 30 by a pin 54 that extends through holes 56 in the dielectric panel 26 and the center of the coil 12. The contact points 16, 18 extend from the openings 28.

Figure 16:
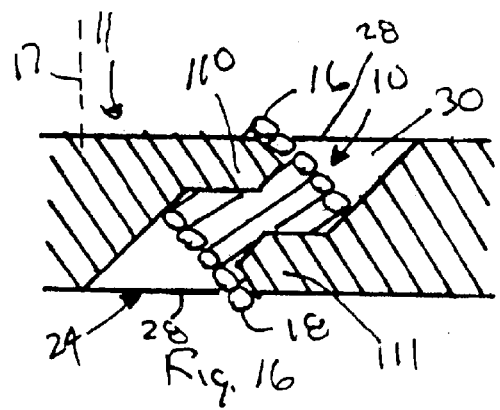
Figure 17:
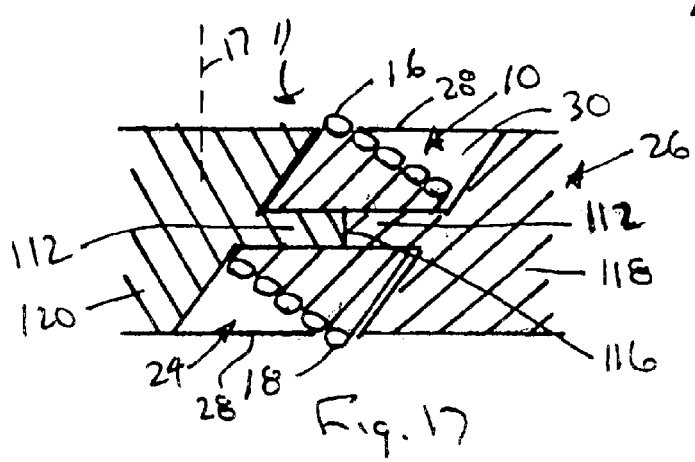

The aperture 24 of FIG. 16 has a protrusion 110 extending from the wall of a center section 30 that is slanted to the direction of compression 17. The protrusion 110 extends into the coil 12 to secure the contact 10 in the aperture 24. A second protrusion 111 is optional. The aperture 24 of FIG. 17 has coaxial protrusions 112 extending from the walls of a center section 30 that is slanted to the direction of compression 17. The dielectric panel 26 separates horizontally at an interface 116 that bisects the aperture 24. The contact 10 is installed in one side of the aperture 24 and then the two panel components 118, 120 are assembled horizontally so that the protrusions both extend into the contact 10.

Figure 18:
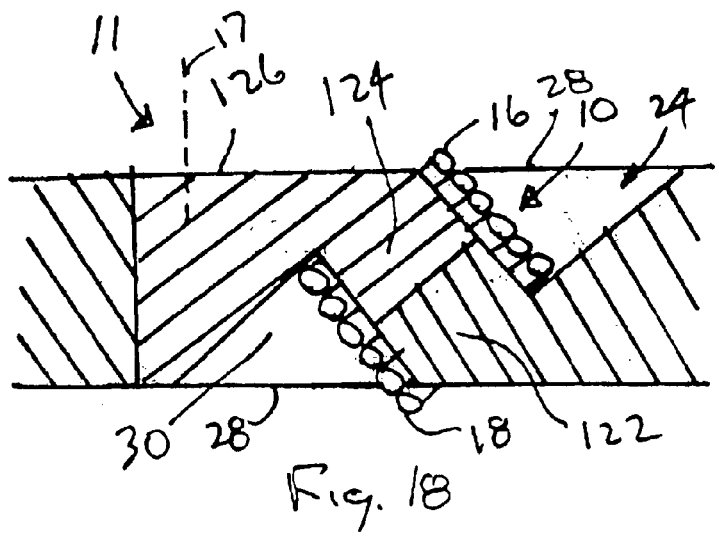

The aperture 24 of FIG. 18 also has a protrusion 122 extending from the wall of the center section 30. After the contact 10 is installed, a plug 126 is installed in the aperture 24 that secures the contact 10 in the aperture. Optionally, there is a protrusion 124 on the plug 126.

Figures 19, 20:
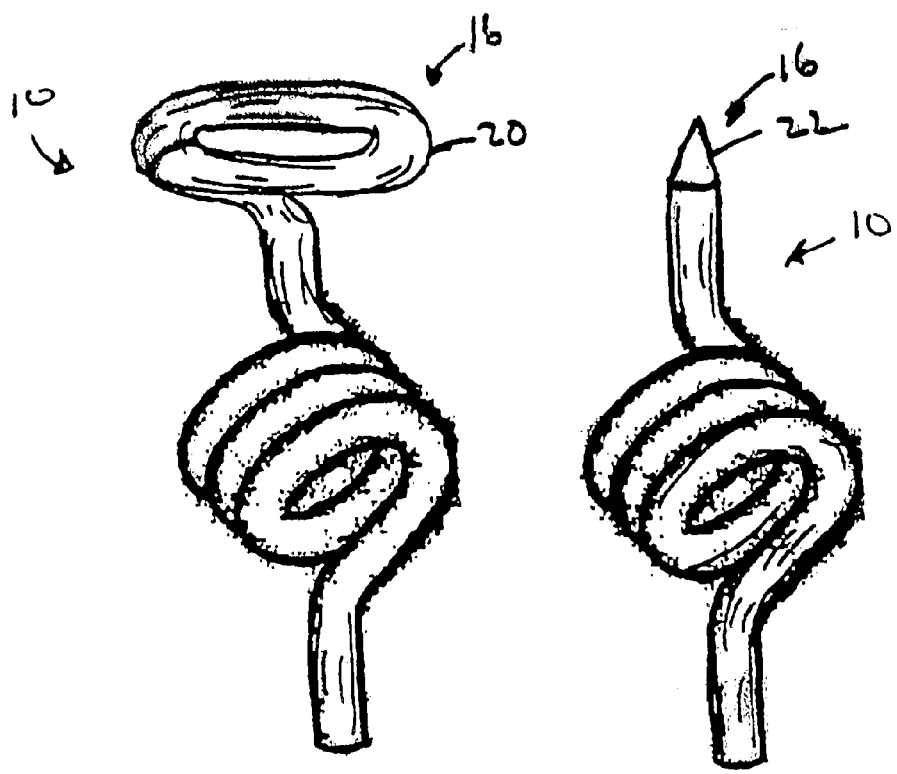
FIG. 19 is a perspective view of the contact with a lead formed into a ring.
FIG. 20 is a perspective view of the contact with a lead tapered to a point.

The contact points 16, 18 can be configured in shapes that aid in contact integrity. One example of a contact point formation is a hemisphere or ring 20, shown in FIG. 19, for receiving a ball contact as in the testing of a ball grid array (BGA) device. Another example is a spear, shown in FIG. 20, with one or more prongs 22 for piercing oxides at the conduction point 6, 8.

Thus it has been shown and described a compliant electrical contact assembly which satisfies the objects set forth above.

Since certain changes may be made in the present disclosure without departing from the scope of the present invention, it is intended that all matter described in the foregoing specification and shown in the accompanying drawings be interpreted as illustrative and not in a limiting sense.

I claim:

1. A compliant electrical contact assembly adapted to provide a temporary electrical connection between a conduction point of a first electrical device and a conduction point of a second electrical device, said electrical devices being compressed together by a compression force in a direction of compression with said assembly therebetween, said assembly comprising:

(a) at least one compliant electrical contact, said contact including a length of wire composed of an electrically conductive, inherently elastic material, said wire being formed into a coil having at least slightly more than one loop and a coil axis, said coil axis being at an angle from said direction of compression, and said contact having generally opposed contact points for electrical connection with said conduction points; and (b) a dielectric panel having a through aperture with an axis for each of said at least one electrical contact, said contact being captured in said aperture, said aperture having opposed openings through which said contact points extend, and said aperture being sized to permit said coil to compress and expand as said compression force is applied and removed.

2. The compliant electrical contact assembly of claim 1 wherein said angle is in the range of from approximately 5 degrees to approximately 90 degrees.

3. The compliant electrical contact assembly of claim 1 wherein said aperture axis is aligned with said direction of compression.

4. The compliant electrical contact assembly of claim 1 wherein said aperture axis is slanted from said direction of compression.

5. The compliant electrical contact assembly of claim 1 wherein said aperture opposed openings are smaller than said contact coil such that said contact coil is captured within said center section.

6. The compliant electrical contact assembly of claim 1 wherein at least one of said contact points is at the end of a lead that is generally parallel to said direction of compression.

7. The compliant electrical contact assembly of claim 1 wherein at least one of said contact points is at the end of a lead that is tangent to said coil.

8. The compliant electrical contact assembly of claim 1 wherein at least one of said contact points is on a hook-shaped lead.

9. The compliant electrical contact assembly of claim 1 wherein said at least slightly more than one loop is at least 1.5 loops and at least one of said contact points is on one of said loops.

10. The compliant electrical contact assembly of claim 1 wherein said aperture is filled with a compliant, conductive elastomer after said contact is installed in said aperture.

11. The compliant electrical contact assembly of claim 1 wherein said wire is metallic.

12. The compliant electrical contact assembly of claim 1 wherein said wire has a cross-sectional dimension and the gap between said loops is no more than 100% of said cross-sectional dimension.

* * * * *